United States Patent

Alleweireldt et al.

[11] Patent Number: 5,899,257
[45] Date of Patent: May 4, 1999

[54] PROCESS FOR THE FABRICATION OF MONOCRYSTALLINE CASTINGS

[75] Inventors: Rodger Rene Alleweireldt, Viry Chatillon; Jacques Leopold Emile Grammagnac, Guignes; Jean-Marc Clement Francis Theret, Versailles, all of France

[73] Assignee: Societe Nationale D'Etude et de Construction de Moteurs D'Aviation, Colombes Cedex, France

[21] Appl. No.: 06/548,673

[22] Filed: Sep. 28, 1983

[30] Foreign Application Priority Data

Sep. 28, 1982 [FR] France ................... 82 16262

[51] Int. Cl.⁶ .................................... B22D 25/00
[52] U.S. Cl. ...................... 164/122.2; 164/122.1
[58] Field of Search ............... 164/122.2, 122.1

[56] References Cited

U.S. PATENT DOCUMENTS

| | | |
|---|---|---|
| 3,536,121 | 10/1970 | Piearcey ................ 164/60 |
| 3,543,284 | 11/1970 | Sink et al. ............... 164/60 |
| 3,690,368 | 9/1972 | Coplet et al. ............ 164/350 |
| 3,739,835 | 6/1973 | Copley et al. ........... 164/35 |
| 3,771,586 | 11/1973 | Waring ................. 164/122.2 |
| 3,888,301 | 6/1975 | Hayes .................. 164/341 |
| 4,175,609 | 11/1979 | Gammal et al. ........ 164/122.2 |

FOREIGN PATENT DOCUMENTS 1365858   9/1974   United Kingdom ........... 164/122.2

*Primary Examiner*—Edward A. Miller
*Attorney, Agent, or Firm*—Bacon & Thomas

[57] ABSTRACT

A process and apparatus for fabricating monocrystalline castings are disclosed in which molten metal is poured into a mold having vertically arranged, individual mold cavities, the solidification front is controlled to progress vertically upwardly from the bottom, and a single crystal grain is selected by a selection device placed in the lower part of the mold. The invention consists in directly superposing a multiplicity of individual mold cavities one above the other in a string, several such strings capable of being placed in parallel between a common metal sprue cup and a chilled plate to increase production capacities.

2 Claims, 1 Drawing Sheet

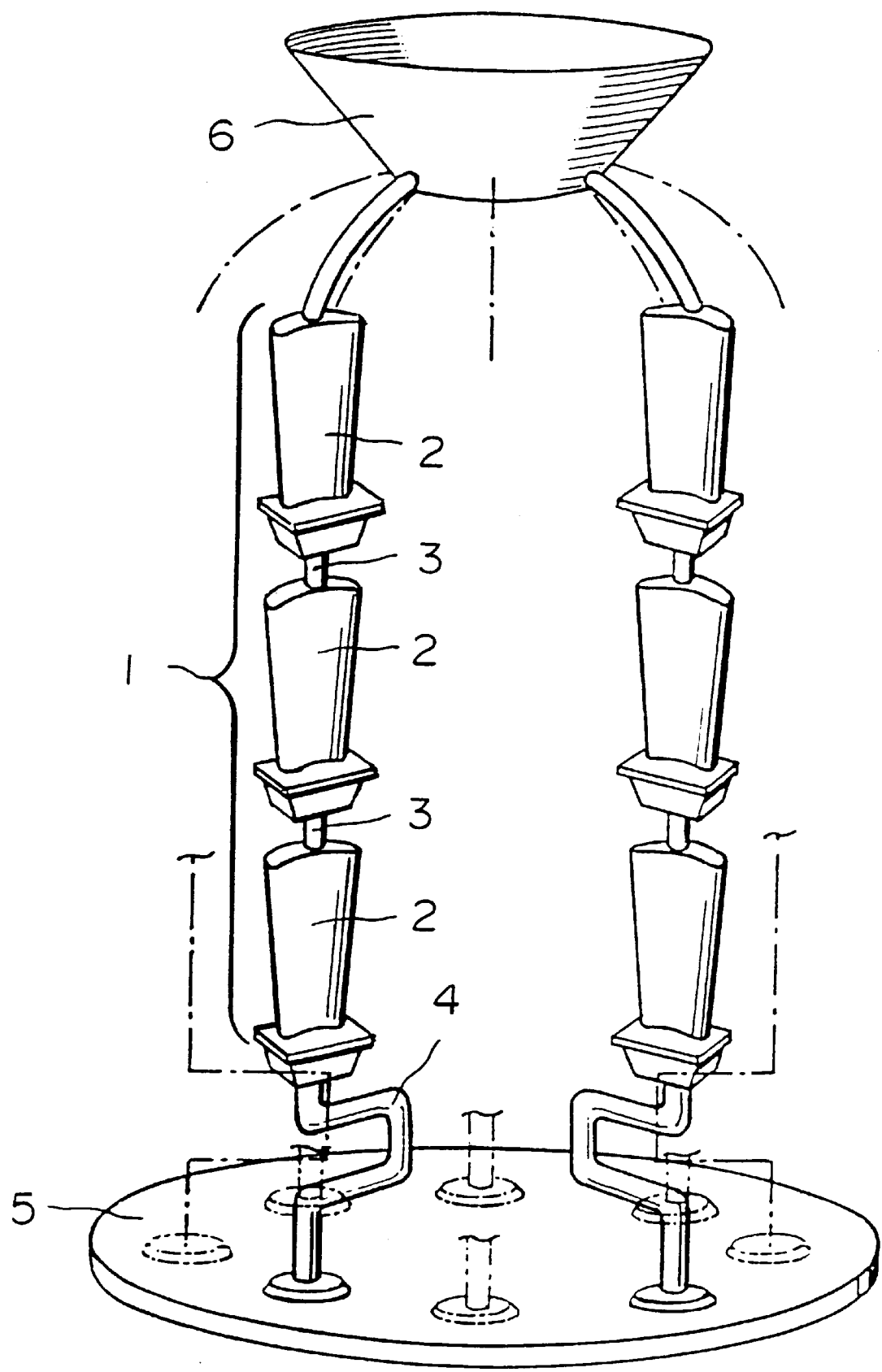

PROCESS FOR THE FABRICATION OF MONOCRYSTALLINE CASTINGS

BACKGROUND OF THE INVENTION

1. Field of the Invention

The invention relates to a process and apparatus for the fabrication of monocrystalline castings in a mold made up of individual mold cavities, of a type in which molten metal is poured into a mold, the solidification front is controlled so that it progresses vertically upwardly from the bottom, and a single crystal grain is selected by a selection device placed in the lower part of the mold.

2. Brief Description of the Prior Art

The simultaneous production of several monocrystalline solidification articles is known, in particular by U.S. Ser. No. 420,348 to Allesandri et al, and by French patents Nos. 1 602 773; 1 602 778; 2 273 611; 2 363 388; and 2 218 939.

As all these documents show that those skilled in the art had thought that simultaneous production such as this could only be accomplished by distributing the castings in parallel.

SUMMARY OF THE INVENTION

The invention aims at proposing a new arrangement of castings that will make an increase in production capacities possible.

According to the invention, this goal is reached by directly superposing a multiplicity of individual mold cavities, one on the other, in a "string".

A "string" is understood to mean an arrangement in which two superposed mold cavities are directly connected by a passageway that will allow the solidification front to progress from the lower cavity to the upper cavity.

There is an advantage, naturally, in arranging several strings in parallel.

There is no limit, theoretically, to the number of castings in a string, the maximum simply being limited by the dimensions of the furnace. Moreover, it is possible to envisage equipment producing a continuous string.

The new arrangement proposed by this invention will surprise the specialist who had, up to this point, believed to the contrary that it was desirable to avoid this type of arrangement in the controlled solidification fabrication procedure.

The same principles often have been adopted for the two major types of controlled solidification fabrication procedures; castings with a columnar structure, and monocrystalline castings.

But the number of grains has a tendency to decrease as the solidification front progresses toward the end of the casting in the case of castings with a columnar structure. The more the grains are caused to grow, the more of them disappear. Thus, the base of a quite long controlled solidification bar can have a multitude of grains and a columnar structure at first, but at the opposite end can very well have a monocrystalline structure. This tendency is even more accentuated when, instead of a smooth bar, the casting has angles, or variations in local cross sections.

This special nature thus prohibits the superposing of castings one on the other in a "string" in order to fabricate castings with a columnar structure prior to enclosing them in "shell" molds because the crystalline structure of the different castings in the string would be completely heterogeneous.

Analysis of these phenomena within the context of the present invention led to the thought that what was an inconvenience for making castings with a columnar structure, was not for making monocrystalline castings.

An even more surprising fact that has been noted within the context of the invention is that, due to the superposition of several castings in a chain to obtain monocrystalline solidification, the passage from one casting to another eliminates possible parasite grain growth (parasite grains often are provoked by a crystal nucleus producing a reaction between the ceramic wall and the metal). Each passage thus constitutes a rudimentary baffle, that is, a rudimentary grain selection device.

The arrangement of castings according to the invention, bringing together the advantages of an arrangement in series and in parallel, is of considerable industrial interest when it is necessary to produce a large number of castings with rigorously identical structural characteristics, such as turbine rotor blades, for example.

BRIEF DESCRIPTION OF THE DRAWING

The sole FIGURE represents schematically, and in perspective, a cluster of twenty-four blades disposed according to the invention in eight "strings" of three blades each.

DETAILED DESCRIPTION OF THE PREFERRED EMBODIMENT

In conformity with the classical lost wax molding process, wax models of the blades to be poured are made and placed according to the invention, superposed end to end in strings 1, each having three blades 2, for example. Passage 3 allows molten metal to pass from one blade to the blade below. The bottom casting in each "string" is connected by a grain selection device in the form of baffle 4 to cooled support plate 5. The top casting in each "string" 1 is coupled to sprue cup 6.

The assembly is encased in shell molds in known fashion and the wax is eliminated to obtain the mold cavities corresponding to the castings to be poured.

We claim:

1. A process for fabricating monocrystalline castings comprising the steps of:

a) arranging a plurality of vertically stationary mold cavities one on top of the other to form a generally vertically oriented string;

b) pouring molten metal in an uppermost mold cavity;

c) allowing the molten metal to pass downwardly so as to fill all of the mold cavities in the string;

d) selecting a single crystal grain by a grain selection device connected to the lowermost mold cavity in the string;

e) connecting the grain selection device to a cooled plate; and, f) controlling the solidification of the metal such that solidification progresses vertically upwardly from the lowermost cavity.

2. The process according to claim 1 comprising the further steps of:

a) arranging a plurality of mold cavity strings in parallel;

b) connecting the uppermost mold cavity in each string to a common metal sprue cup; and, c) pouring molten metal into the sprue cup such that each mold cavity string is filled substantially simultaneously.

* * * * *

UNITED STATES PATENT AND TRADEMARK OFFICE
CERTIFICATE OF CORRECTION

PATENT NO. : 5,899,257
DATED : May 4, 1999
INVENTOR(S) : Roger Alleweireldt et al.

It is certified that error appears in the above-indentified patent and that said Letters Patent is hereby corrected as shown below:

Title page item [75],
           The spelling of the first named inventor is "Roger Rene Alleweireldt"

Signed and Sealed this

Fifteenth Day of August, 2000

Attest:

Q. TODD DICKINSON

*Attesting Officer*        *Director of Patents and Trademarks*